United States Patent [19]
Parks et al.

[11] Patent Number: 5,893,137
[45] Date of Patent: Apr. 6, 1999

[54] APPARATUS AND METHOD FOR IMPLEMENTING A CONTENT ADDRESSABLE MEMORY CIRCUIT WITH TWO STAGE MATCHING

[75] Inventors: Charley Michael Parks; Jon Ashor Loschke, both of Austin, Tex.

[73] Assignee: Motorola, Inc., Schaumburg, Ill.

[21] Appl. No.: 753,752

[22] Filed: Nov. 29, 1996

[51] Int. Cl.⁶ .................................................. G06F 12/00
[52] U.S. Cl. ............................................................ 711/108
[58] Field of Search ................................ 711/108; 365/49

[56] References Cited

U.S. PATENT DOCUMENTS

| | | | |
|---|---|---|---|
| 4,558,176 | 12/1985 | Arnold et al. | 380/4 |
| 4,758,982 | 7/1988 | Price | 711/108 |
| 4,918,597 | 4/1990 | Krishnan et al. | 395/309 |
| 5,619,446 | 4/1997 | Yoneda et al. | 365/49 |
| 5,659,697 | 8/1997 | Dietz | 711/207 |
| 5,715,188 | 2/1998 | Covino et al. | 365/49 |
| 5,806,083 | 9/1998 | Edgar | 711/108 |

OTHER PUBLICATIONS

Hennessy et al., "Computer Organization and Design: The Hardware & Software Interface", ISBN 1-55860-281-X, Morgan Kaufmann Publishers, Inc., p. 509, 1994.

*Primary Examiner*—Tod R. Swann
*Assistant Examiner*—Felix B. Lee
*Attorney, Agent, or Firm*—Lee E. Chastain

[57] ABSTRACT

A circuit and method is provided for implementing a content addressable memory circuit (100) in which at least one output word is produced which corresponds to the content of a match word. A binary search logic circuit (103) binarily searches the memory array (101) to find a match entry with multiple words whose content is equal to that of an input value with multiple words. The amount of words in each match entry is user programmable and defined at startup. The CAM (100) is capable of masking out words to be compared or outputted and allows overlapping of words to be compared and outputted. Output signals indicate whether a match has been found.

24 Claims, 4 Drawing Sheets

APPARATUS AND METHOD FOR IMPLEMENTING A CONTENT ADDRESSABLE MEMORY CIRCUIT WITH TWO STAGE MATCHING

FIELD OF THE INVENTION

The present invention generally relates to digital electronic devices, and more specifically to devices used to manage data in associative memories.

BACKGROUND OF THE INVENTION

Communication networks consist of a variety of hardware equipment and software and are increasing in use and complexity. The popularity of communication networks and the growth in amount of data transferred between network users has forced the capacity of networks and protocols to increase with time. A variety of network communication protocols transfer data between devices coupled by a network. Ethernet and Asynchronous Transfer Mode are examples of such communication protocols.

Asynchronous Transfer Mode ("ATM", hereafter) provides bandwidths as low as 25 megabits/second using twisted cables and as high as 10 gigabits/second using optical cables. An ATM switch transfers cells between various points in a network. A cell contains control information, a header, and a data packet. The header within the cell contains switching identifiers enabling the ATM switch to route the data. The ATM switch interrogates each switching identifier it receives against a programmed list to determine which output channel the cell should be output. When the data packets are received by the intermediate node, destination information is contained in header which accompanies the data packet. The node determines whether it has previously agreed to route the data packets for that transmission by examining its memory to determine whether the destination information has previously been stored. If it has, a forwarding address has also been stored and the node forwards the data packet to the next node in the route toward the destination address.

Content addressable memories ("CAM", hereafter) store the switching identifiers for the ATM switch. In a CAM, match words and switching identifiers are stored in associated pairs in memory. When the CAM receives a reference word it determines whether a match word equal to the reference word is stored in memory. If so, it produces the link word associated with the matched reference word. An important aspect of a CAM is the association between the match word and its associated link word, much like a dictionary, where each word is stored in association with its definition. In a dictionary, a provided word is looked up and the definition associated with the word is produced. In a CAM, a provided reference word is looked up, i.e., compared with a match word and, if they are equal, a link word associated with the match word is produced.

In general, the memory array of an ATM CAM is organized into a match word table and a link word table. If a reference word matches an entry from a match word table, the associated link word is produced at the output. If no match is found, the output word indicates the failure by, for example, setting an error flag bit.

Smaller sized CAMs often provide this function in hardware such that the reference word is simultaneously compared with every word in the match word table, thereby operating in a full parallel mode in which the output word is produced in one clock cycle. However, as the need for larger CAMs grows, the parallel mode is not possible due to larger die sizes and power constraints.

Also, the match word tables contain only one word per CAM entry, limiting the amount of switching identifier information in association with each CAM entry. However, the communication networks are growing and need the flexibility of adding or deleting match bits to the CAM entry in the match word table. Preferably, such flexibility would not require new hardware or software. As communication networks and ATM switches handle more switching identifier information and data at higher speeds, a need exists to store and compare more switching identifier information and data per CAM entry in the match word table.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF THE DRAWINGS

Figure 1:
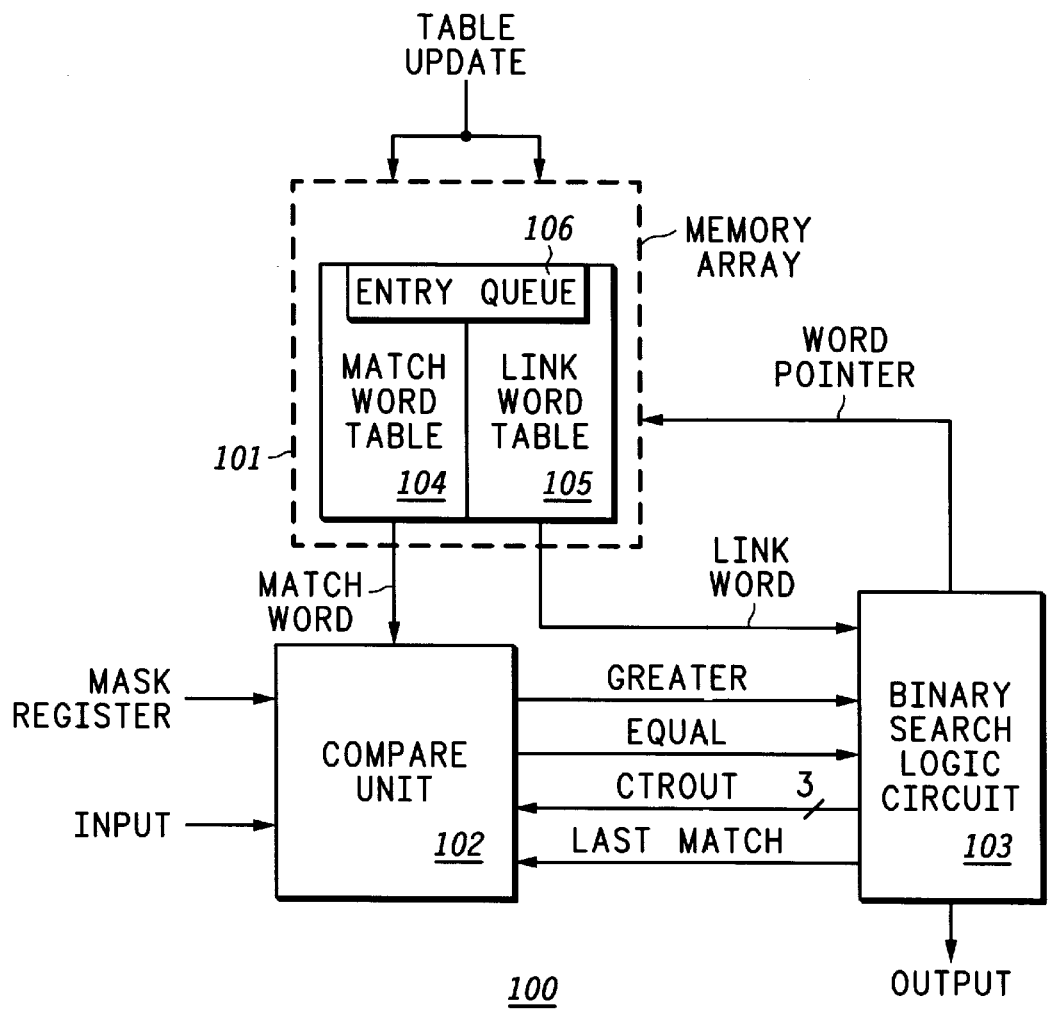
FIG. 1 depicts a block diagram of a content addressable memory circuit constructed in accordance with the present invention.

FIG. 1 is a block diagram of a content addressable memory (CAM) circuit 100 constructed in accordance with the present invention. CAM 100 stores data in and access data for comparison according to a novel method. The novel method allow a great variety of flexibility that is programmable by the user. Consequently a single instantiation of CAM 100 may be used in applications with a wide variety of matching requirements and with a wide variety of data output requirements. The single instantiation of CAM 100 may be configured to match an input data word against one or more of a plurality of words associated in a single entry. Furthermore, a portion of the same entries may be output as data from CAM 100 in the event of a match. Also, a matching entry may be used to access an associated output word.

Continuing with FIG. 1, CAM 100 comprises a memory array 101, a Compare unit 102, and a binary search logic circuit 103.

Memory array 101 receives initial table data, TABLE UPDATE, from an external source and a WORD POINTER from binary search logic circuit 103. A match word table 104 and a link word table 105 within memory array 101 generate a MATCH WORD signal and a LINK WORD signal, respectively, responsive to the particular value of WORD POINTER. Memory array 101 also has an entry queue 106 for buffering data prior to storage in match word table 104 and link word table 105.

Compare unit 102 receives the MATCH WORD signal output from memory array 101, an output from a MASK REGISTER (see FIG. 2), an INPUT signal from an external source, and a CTROUT and LAST MATCH signal from binary search logic circuit 103. Compare unit 102 generates a GREATER signal and an EQUAL signal.

Binary search logic circuit 103 receives the LINK WORD signal output from memory array 101, and the GREATER signal and EQUAL signal from compare unit 102. Binary search logic circuit 103 generates a CTROUT, a LAST MATCH and an OUTPUT signal.

Memory array 101 comprises a core of static random access memory (RAM) cells and is configured as a match word table 104 and a link word table 105. At each location address in memory array 101, a stored match word entry corresponds to a stored link word. According to the present invention, the match word table entry may consist of multiple words, each of which must match an input match word to generate a "match." The number of words which must match an input match word is user programmable. In a second embodiment, the link word table is interleaved with the match word table. In this embodiment, one or more words in a particular entry must also match to generate a hit. The remaining words in the "match" entry are output as the OUTPUT data. The number of words which are output is user programmable. In yet another embodiment, a portion of the matching words may also be output to confirm to the user that a match did indeed occur, or for any other purpose. The number of words which are both matched and output also is user programmable.

Memory array 101 outputs match data specified by the WORD POINTER to compare unit 102. Memory array 101 also outputs a LINK WORD associated with a corresponding WORD POINTER signal to binary search logic circuit 103. The method of searching match word table 104 is described below.

Compare unit 102 compares INPUT and MATCH WORD and generates the signals GREATER and EQUAL in response thereto. Compare unit 102 receives via INPUT one or more match words for comparison against one or more match words per match word entry. These match words are buffered in a buffer (depicted in FIG. 4) for comparison during match operations. Compare unit 102 compares one of its buffered inputs against the MATCH WORD output by memory array 101. Compare unit 102 chooses which of its buffered inputs it compares by the input CTROUT. Compare unit 102 asserts its output GREATER if its input match word was greater than the selected buffer input. Compare unit 102 asserts the output EQUAL if the input MATCH WORD was equal to the selected buffered input. If neither GREATER or EQUAL are asserted, then the input MATCH WORD is less than the selected buffered input.

Binary search logic circuit 103 generates the WORD POINTER according to a binary search algorithm and a linear search algorithm. Binary search logic circuit 103 accesses each entry in match word table 104 according to a binary search algorithm. Binary search logic circuit 103 continues searching within each individual entry in match word table 104 according to a linear algorithm. As described above, this allows CAM 100 to match variable length inputs against stored data without having to redesign CAM 100.

Initially, binary search logic circuit 103 accesses the middle entry of match word table 104. If the middle entry in match word table 104 matches the INPUT match data, then binary search logic circuit 103 outputs the associated link word or other data as the OUTPUT. Normally, binary search logic circuit 103 must continue searching match word table 104 for a match. In this case, binary search logic circuit 103 continues searching in the half of match word table 104 where the desired match word must reside. Binary search logic circuit 103 determines in which half the desired match word must reside by evaluating the inputs GREATER and EQUAL. For instance, if the match word at the middle entry of match word table 104 was greater than the selected input, then binary search logic circuit 103 will access the match word located half way between the central position and the beginning of match word table 104. Here, compare unit 102 will make the same comparison between the new match word table and the selected buffered INPUT. Binary search logic circuit 103 will continue halving the remaining portion of match word table 104 until it either finds a match or exhausts all possible locations in match word table 104.

As described below, binary search logic circuit 103 may actually search two or more associated match words from a single entry in match word table 104 before declaring a match or a miss-match. These multiple input match words are buffered in compare unit 102 and selected by the control signal CTROUT.

Binary search requires that match word table 104 be sorted into a predetermined order. In the preferred embodiment the match words stored in match word table 104 are stored in ascending order. Specifically, the match word and link word pair having the lowest match word value are stored in the first position in match word in memory array 101. The match word and link word pair having the second lowest match word value are stored in the second entry in memory array 101, etc. In theory, the match words in match word table 104 can be sorted into any predetermined order. However, the order must be discernible by the compare unit 102 such that it may generate the GREATER and EQUAL control signals.

Binary search logic circuit 103 also asserts LAST MATCH when it performs the last match word comparison. This control signal assists in the operation of a partial word comparison as described below.

Figure 2:
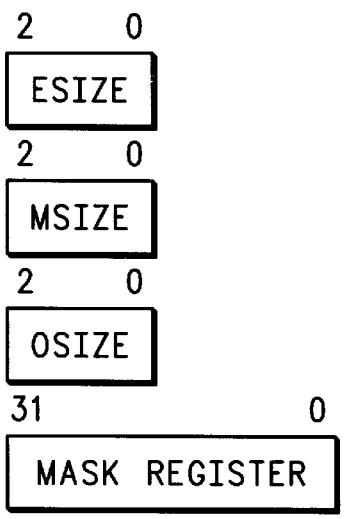
FIG. 2 depicts a block diagram of a programmer's view of the content addressable memory circuit depicted in FIG. 1.

FIG. 2 depicts in block diagram format a programmer's view of CAM 100 depicted in FIG. 1. The programmers model of CAM 100 consists of four user programmable registers, ESIZE, MSIZE, OSIZE, and MASK REGISTER. The contents of register ESIZE define how many words there are in each entry in match word table 104. The register MSIZE defines how many words must match in each entry of match word table 104 to generate a "match." The register OSIZE defines how many words in each entry are output as OUTPUT data in the event of a "match." In the described embodiment, CAM 100 outputs the last X values of a matching match word entry, where X is the integer value of OSIZE. The MASK REGISTER defines which bits must match between the last word in each match word table entry and the last buffered INPUT.

In the depicted embodiment, ESIZE, MSIZE, and OSIZE are each three bit registers. Consequently, each match word table entry may consist of from one to eight words. Of these eight words, up to eight of them may be required to be matched to define a match condition and up to eight of them may be output as OUTPUT data. The MASK REGISTER contains as many bits as exist in each match word. Consequently, any portion of the last match word (as defined by MSIZE) may be ignored. The MASK REGISTER enables matching on a fractional word size basis. In the described embodiment, each word in match word table 104 is thirty-two bits wide. One skilled in the art will readily appreciate that the particular sizes of the registers. ESIZE, MSIZE, OSIZE, and MASK REGISTER may be modified to suit the particular requirements of a particular embodiment.

Figure 3:
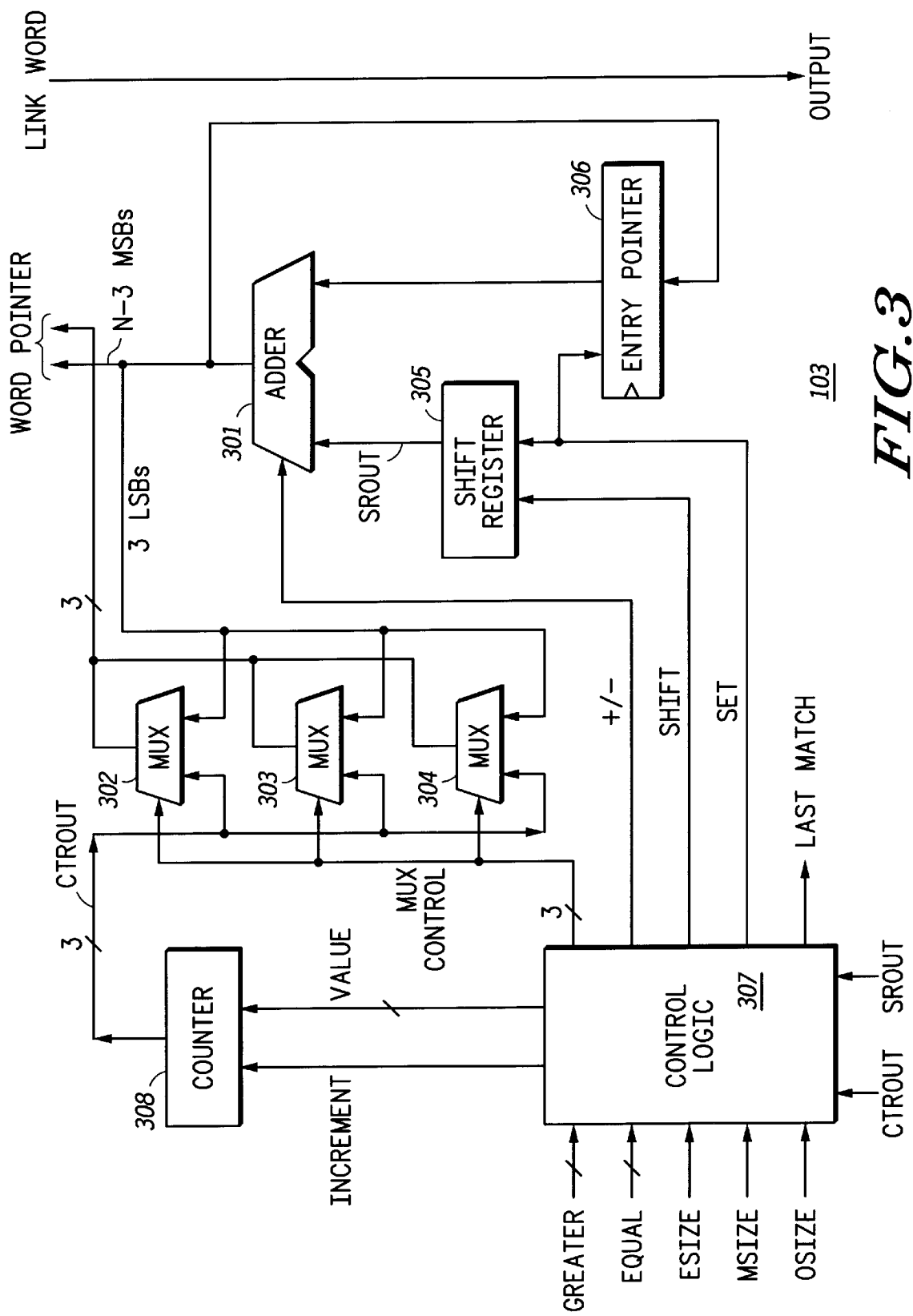
FIG. 3 depicts a block diagram of the binary search logic circuit depicted in FIG. 1.

FIG. 3 depicts a block diagram of the binary search logic circuit 103 depicted in FIG. 1. The concatenation of the N–3 most significant bits of the output of an adder 301 and three bits output from the three one-bit MUXs 302, 303, and 304 generate the WORD POINTER connected to memory array 101. As described above, the WORD POINTER selects an individual word in match word table 104 whose output is to be compared by compare unit 102.

Adder 301 receives the output of a shift register 305 and an output of an ENTRY POINTER 306. Adder 301 adds the output of shift register 305 and ENTRY POINTER 306 if the control signal +/− is asserted by control logic 307. Otherwise, adder 301 subtracts the output of shift register 305 from the output of ENTRY POINTER 306.

The contents of shift register 305 are forced to the bit pattern one followed by all zeros (1000 . . . 000) upon the assertion of the control signal SET by control logic 307. The one is rotated from the most significant bit to the least significant bit by shift register 305 by one bit position per low-to-high transition of the control SHIFT.

Entry pointer 306 is set to a value consisting of all zeros upon the assertion of the control signal SET. Otherwise, the output of adder 301 is written into ENTRY POINTER 306 each clock cycle of CAM 100.

Each of MUXs 302, 303, and 304 receive one bit of the three least significant bits (LSBs) output from adder 301. Each of MUXs 302, 303, and 304 also receive the corresponding one bit output from a three-bit counter 308.

The contents of counter 308 may be written to by control logic 307 via a path VALUE. The contents of counter 308 are incremented by one upon the low-to-high transition of the control signal INCREMENT generated by control logic 307.

Control logic 307 generates the three-bit control signal MUX CONTROL. MUX CONTROL selects which input each of MUXs 302, 303, and 304 output as the three least significant bits of WORD POINTER. Control logic 307 also receives control signals CTROUT, SROUT, GREATER, EQUAL, ESIZE, MSIZE, and OSIZE. Control logic 307 generates the control signal LAST MATCH which is output to compare unit 102 (depicted in FIG. 1).

In operation, adder 301 generates the most significant bits of each new WORD POINTER value and MUXs 302, 303, and 304 generate the least significant bits of the word pointer. As described, the WORD POINTER executes a binary search algorithm as it moves from entry to entry in match word table 104 and executes a linear search within a single entry in match word table 104. The value stored in register ESIZE determines how many match words exist in each entry and consequently, how many bits of the WORD POINTER follow a binary search algorithm and how many bits follow a linear search algorithm. For instance, if the value stored in register ESIZE equals four, then the two least significant bits of the WORD POINTER will be used to linearly search with a single match word entry. All other bits will be used to perform a binary search between separate match entries.

In general, adder 301 generates the binary portion of the search algorithm. This binary portion is generated by summing the ENTRY POINTER 306 and half of the size of the remaining portion of match word table 104 to be searched. Half of the portion of match word table 104 to be searched is determined by the contents of shift register 305. As binary search logic circuit 103 progresses, the value in shift register 305 generates a smaller addition or subtraction value. This value decreases by one-half each time shift register 305 is shifted. If the single one value in shift register 305 shifts completely from left to right, then the entire array has been searched.

Generally, counter 308 generates the linear portion of the search algorithm. Control logic 307 loads the value zero into counter 308 when it enters an entry and then increments it until it is searched through all match words in the entry.

MUXs 302, 303, and 304 function to blend the two search algorithms together. Ones skilled in the art will appreciate that the number of least significant bits following the linear search algorithm and the number of most significant bits following the binary search algorithm will change depending upon the maximum number of words that is permitted in each entry. In the described embodiment, there are one through eight possible words in each entry. Therefore, up to three bits may be needed to describe their position in a match entry. Control logic 307 blends these up to three bits with the output of adder 301 depending upon how many words are actually selected by the contents of the register ESIZE. For instance, if there are 8 words in each entry of match word table 104, then control logic 307 will select 3 bits from counter 308 to be concatenated with the N−3 most significant bits of the output of adder 301. Conversely, if there are only two words in each entry of match word table 104, then control logic 307 will couple the output of MUX 302 to the CTROUT input of MUX 302. Similarly, control logic 307 will couple the 3 LSBs input of MUX 303 and MUX 304 to the outputs of those same MUXs. In this case, the WORD POINTER will consist of the N−1 most significant bits output from adder 301 and the one least significant bit output from counter 308.

Control logic 307 asserts LAST MATCH when the contents of counter 308 (CTROUT) equal the value stored in the register MSIZE. LAST MATCH is described below in connection with FIG. 4.

Figure 4:
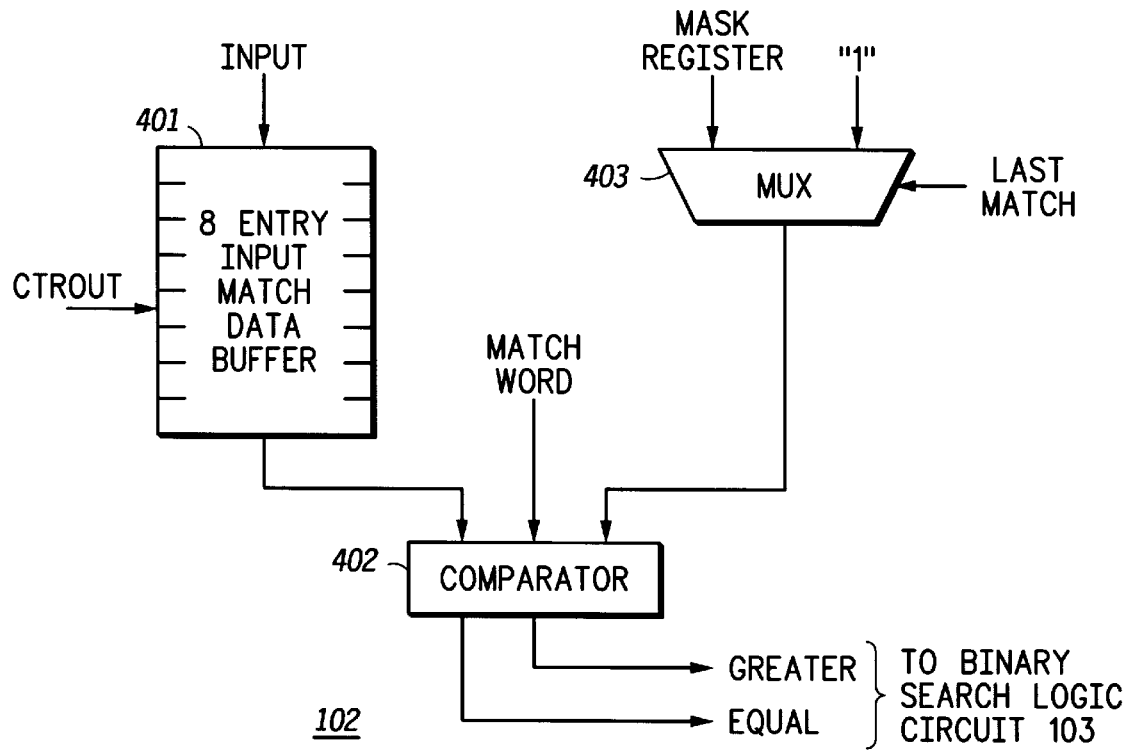
FIG. 4 depicts a block diagram of the compare circuit depicted in FIG. 1.

FIG. 4 depicts a block diagram of compare unit 102 depicted in FIG. 1. Compare unit 102 comprises an eight entry input match data buffer (buffer) 401, a comparator 402, and a multiplexer (MUX) 403. Buffer 401 buffers up to eight entries input to CAM 100 for a comparison against match words stored in match word table 104. The control signal CTROUT selects which of the 8 entries buffered in buffer 401 are output to comparator 402. MUX 403 receives the outputs of the MASK REGISTER and a binary pattern consisting of all ones (111 . . . 111). A control signal LAST MATCH selects which of the two inputs to MUX 403 are output to comparator 402. Comparator 402 also receives the match word output from match word table 104 in response to the value of WORD POINTER (depicted in FIG. 1).

In operation, comparator 402 compares the output of buffer 401 with the match word output by match word table 104. If the match word is greater than the output of buffer 401, then comparator 402 asserts the control signal GREATER. If the match word is equal to the output of buffer 401, then comparator 402 asserts the control signal EQUAL. If the match word is less than the output of buffer 401, then comparator 402 asserts neither GREATER or EQUAL.

Comparator 402 can mask portions of the match word it compares to the output of buffer 401. Specifically, if MUX 403 outputs its MASK REGISTER input, then comparator 402 will only compare those bits corresponding to a logic one in the mask register. Control logic 307 (depicted in FIG. 3) selects the MASK REGISTER input as the output of MUX 403 when it compares the last word in a match word table entry. This feature allows CAM 100 to compare fractional words for greatest flexibility.

Figure 5:
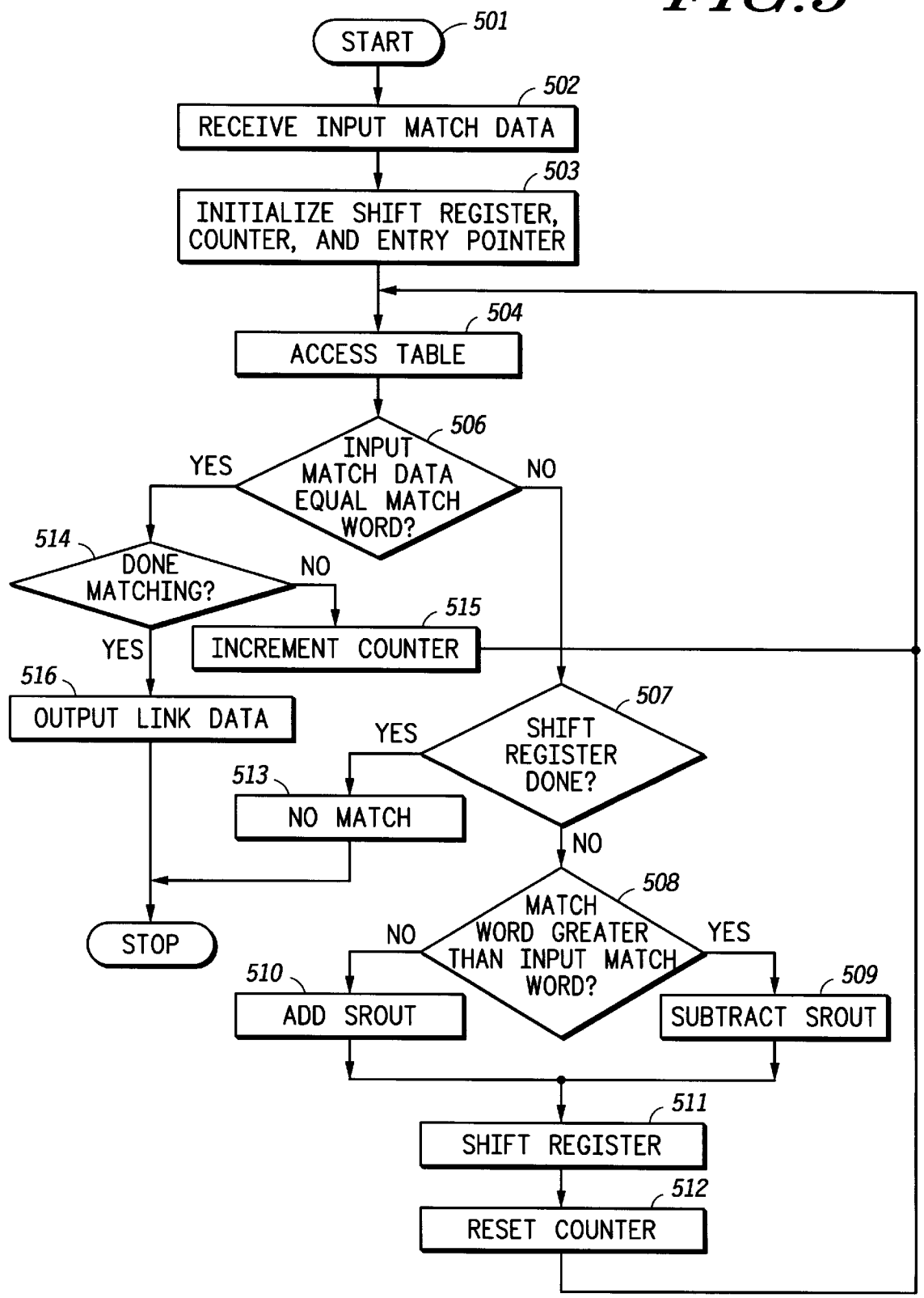
FIG. 5 depicts a flow chart of the operation of the content addressable memory circuit depicted in FIG. 1.

FIG. 5 depicts a flow chart of the operation of CAM 100 depicted in FIG. 1. Control logic 307 begins at step 501. Initially, input match data is buffered in buffer 401 (See FIG.

4), a step 502. Next, control logic 307 sets the contents of shift register 305 to the bit pattern (100 . . . 000), stores the value zero into the counter 308, and sets the value of ENTRY POINTER 306 to zero (all depicted in FIG. 3), a step 503. Binary search logic circuit 103 generates its first WORD POINTER value, accessing a particular entry and word in match word table 104, a step 504. Compare unit 102 compares the match word so accessed and the output of buffer 401, a step 506.

If comparator 402 does not detect a match, then control logic 307 determines if shift register 305 has fully shifted its one from the most significant bit position to the least significant bit position, a step 507. Control logic 307 monitors the contents of shift register 305 by receiving the output of shift register 305, SROUT.

If shift register 305 has not fully shifted its one value from its most significant bit position to its least significant bit position, then binary search logic circuit 103 may continue searching memory array 101. In a step 508, control logic 307 and comparator 402 determine if the match word output by match word table 104 is greater than the match word output by buffer 401, a step 508. If the match word output by match word table 104 is greater than the match word output by buffer 401, then control logic 307 deasserts the control signal +/− forcing adder 301 to subtract the contents of shift register 305 from the contents of ENTRY POINTER 306, a step 509. If the match word output by match word table 104 is not greater than the match word output by buffer 401, then control logic 307 asserts the control signal +/− causing adder 301 to add the contents of shift register 305 and ENTRY POINTER 306, a step 510. In both cases, control logic 307 shifts the bit pattern in shift register 305 by one position from most significant bit to least significant bit, a step 511, and resets counter 308, a step 502. Binary search logic circuit 103 presents the new WORD POINTER to memory array 101 by returning to step 504. Another match word entry in CAM 100 is thereby accessed for comparison.

If shift register 305 has fully shifted its one value from its most significant bit position to its least significant bit position, then binary search logic circuit 103 has completed its search without finding a match, a step 513. An error flag may be set by control logic 307 to indicate the failure.

Returning to step 506, the data output by match word table 104 may equal the data output by buffer 401. In this case, control logic 307 must determine if it has matched all words in a given entry as required by the contents of MSIZE, a step 514. If there remain words to be matched in a given entry of match word table 104, then control logic 307 increments the counter, the contents of 307, a step 515 before returning to step 504. Another match word in the same match entry is thereby accessed for comparison. Compare unit 102 will continue, matching the ith match word output by match word table 104 against the ith match word buffered by buffer 401, where i is an integer index ranging from one to the value stored in register MSIZE.

Instead, if control logic 307 has accessed every word in a given entry, then control logic 307 will output the corresponding link data, a step 516 before completing its operation. In one embodiment of the disclosed invention, control logic 307 outputs link data pursuant to step 516 by applying a WORD POINTER value to link word table 105. However, link word table 105 may be interleaved into match word table 104. In this case, control logic 307 outputs link data pursuant to step 516, as described immediately below.

Figure 6:
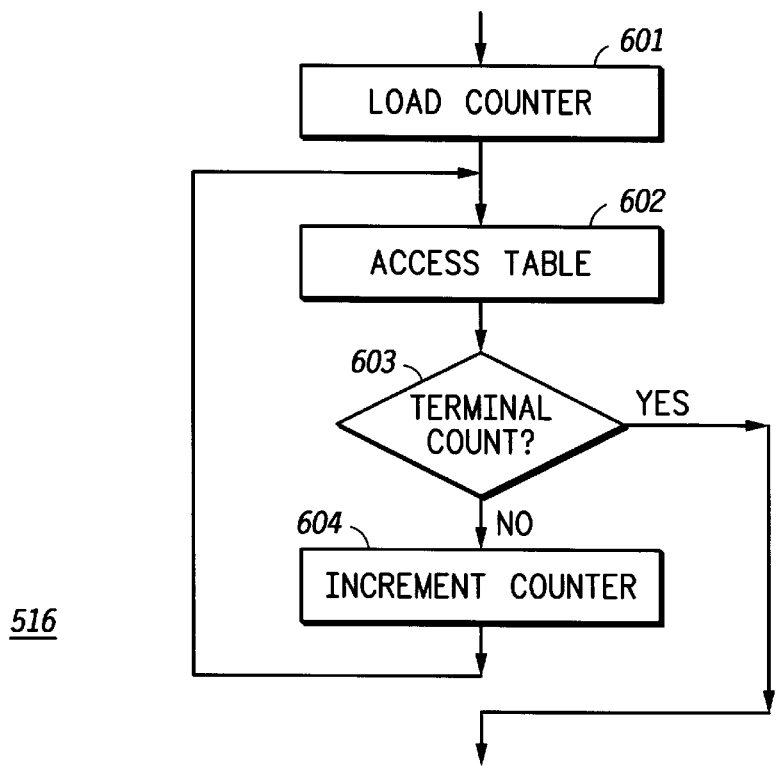
FIG. 6 depicts a flow chart of a step depicted in FIG. 5.

FIG. 6 depicts a flow chart of step 516 depicted in FIG. 5. Here, CAM 100 interleaves its output data with its match data. Therefore, CAM 100 outputs a portion of the data stored within a match word table entry. Step 516 begins when control logic 307 loads a certain value into counter 308, a step 601. In the described embodiment, control logic 307 loads an index identifying the first match word to be output from match word table 104. Control logic 307 determines this first value by concatenating the output of adder 301 with the difference of the value of ESIZE and OSIZE. This difference is initially stored in counter 308. Binary search logic circuit 103 applies this new word pointer value to memory array 101, a step 602. Next, control logic 307 determines if it has cycled to the end of the entry in which it is outputting data, a step 603. Control logic 307 monitors where it is within a particular entry by monitoring the value of counter 308, CTROUT.

If counter 308 has reached the maximum value within a particular entry, then step 516 is over. If counter 308 has not reached the terminal count, then control logic 307 increments the value of counter 308 before returning to step 602. In this way, binary search logic circuit 103 may output any number of match words from a particular entry which meets the matching requirements defined by MSIZE. It should also be noted that the foregoing method may be applied to a separate link word table 105.

Although the present invention has been described with reference to a specific embodiment, further modifications and improvements will occur to those skilled in the art. It is to be understood therefore, that the invention encompasses all such modifications that do not depart from the spirit and scope of the invention as defined in the appended claims.

We claim:

1. A method for implementing a content addressable memory (CAM), the CAM comprising a first memory array the first memory array comprising a plurality of entries each one of the plurality of entries further comprising a plurality of words the method comprising the steps of:

accessing a first word in a first entry;

comparing a first value stored in the first word of the first entry to a first portion of an input value;

accessing a second word in the first entry responsive to the step of comparing;

comparing a second value stored in the second word of the first entry to a second portion of the input value;

responsive to a non-match result in the step of comparing a second value stored in the second word of the first entry;

accessing a first word in a second entry in the first memory array;

comparing a first value stored in the first word of the second entry to the first portion of the input value;

accessing a second word in the second entry responsive to the step of comparing;

comparing a second value stored in the second word of the second entry to a second portion of the input value; and generating a match signal responsive to the step of comparing a second value.

2. The method of claim 1 wherein the step of accessing the first word in the second entry is according to a binary search and the binary search further comprises the steps of:

while the contents of a selected location is not equivalent to the first portion of the input value, performing a loop comprising the steps of;

accessing a location in the first memory array, the selected location, the location dividing the first memory array into a first fraction and a second fraction;

comparing the contents of the selected location to the first portion of the input value;

selecting the first fraction or the second fraction as a subset of the first memory array to search in a subsequent loop iteration.

3. The method of claim 1 further comprising the step of:

outputting at least one value stored in the second entry as an output of the CAM responsive to the step of generating.

4. The method of claim 3 further comprising the step of:

outputting the second word of the second entry as an output of the CAM responsive to the step of generating.

5. The method of claim 1 further comprising the step of:

outputting a first output value stored in a second memory array, the second memory array comprising a plurality of storage elements, each one of the plurality of storage elements corresponding to a differing one of the plurality of entries in the first memory array.

6. The method of claim 5 wherein the step of accessing the first word in the second entry is according to a binary search and the binary search further comprises the steps of:

while the contents of a selected location is not equivalent to the first portion of the input value, performing a loop comprising the steps of;

accessing a location in the first memory array, the selected location, the location dividing the first memory array into a first fraction and a second fraction;

comparing the contents of the selected location to the first portion of the input value;

selecting the first fraction or the second fraction as a subset of the first memory array to search in a subsequent loop iteration.

7. The method of claim 5 further comprising the step of:

outputting a first output value stored in a second memory array, the second memory array comprising a plurality of storage elements, each one of the plurality of storage elements corresponding to a differing one of the plurality of entries in the first memory array.

8. An apparatus implementing a content addressable memory (CAM), comprising:

a memory array comprising a plurality of entries, each one of the plurality of entries comprising a plurality of words; and control circuitry for accessing a plurality of entries in the memory array for comparison to an input according to a binary search and for accessing a plurality of words in a particular one of the plurality of entries in a sequential order, in the binary search, while the contents of a selected location is not equivalent to the first portion of the input value, performing a loop comprising the steps of;

accessing a location in the memory array the selected location the location dividing the memory array into a first fraction and a second fraction;

comparing the contents of the selected location to the first portion of the input value;

selecting the first fraction or the second fraction as a subset of the memory array to search in a subsequent loop iteration.

9. The apparatus of claim 8, further comprising:

a first user programmable register storing a first value, the first value indicative of a number of words in each one of the plurality of entries.

10. The apparatus of claim 9, further comprising:

a second user programmable register storing a second value, the second value indicative of a number of words in each one of the plurality of entries to match against the input.

11. The apparatus of claim 10, further comprising:

a third user programmable register storing a third value, the third value indicative of a number of words in each one of the plurality of entries to output responsive to a match condition.

12. The apparatus of claim 11, further comprising:

a fourth user programmable register storing a fourth value, the fourth value indicative of a portion of at least one of the plurality of words to be matched against the input and a portion of at least one of the plurality of words to not be matched against the input.

13. The apparatus of claim 8, further comprising:

a first user programmable register storing a first value, the first value indicative of a number of words in each one of the plurality of entries.

14. The apparatus of claim 13, further comprising:

a second user programmable register storing a second value, the second value indicative of a number of words in each one of the plurality of entries to match against the input.

15. The apparatus of claim 14, further comprising:

a third user programmable register storing a third value, the third value indicative of a number of words in each one of the plurality of entries to output responsive to a match condition.

16. The apparatus of claim 15, further comprising:

a fourth user programmable register storing a fourth value, the fourth value indicative of a portion of at least one of the plurality of words to be matched against the input and a portion of at least one of the plurality of words to not be matched against the input.

17. The apparatus of claim 8, further comprising:

a second user programmable register storing a second value, the second value indicative of a number of words in each one of the plurality of entries to match against the input.

18. The apparatus of claim 8, further comprising:

a third user programmable register storing a third value, the third value indicative of a number of words in each one of the plurality of entries to output responsive to a match condition.

19. The apparatus of claim 8, further comprising:

a fourth user programmable register storing a fourth value, the fourth value indicative of a portion of at least one of the plurality of words to be matched against the input and a portion of at least one of the plurality of words to not be matched against the input.

20. An apparatus for searching a content addressable memory (CAM), comprising:

a first pointer storing a first value;

a second pointer storing a second value;

control circuitry for altering the first value stored according to a first search algorithm and for altering the second value according to a second search algorithm;

circuitry for combining the first value and the second value; and a memory array comprising a plurality of entries, each one of the plurality of entries comprising a plurality of words; the memory array selecting a single match word responsive to a combination of the first value and the second value.

21. The apparatus of claim 20 wherein the first search algorithm and the second search algorithm are different.

22. The apparatus of claim 20 wherein the first search algorithm is a binary search and the second search algorithm is a linear search.

23. The apparatus of claim 22 wherein the circuitry for combining comprises:
- a plurality of multiplexers, each one of the plurality of multiplexers receiving a differing one of a plurality of bits comprising the first value and a differing one of a plurality of bits comprising the second value.

24. The apparatus of claim 20 wherein the circuitry for combining comprises:
- a plurality of multiplexers, each one of the plurality of multiplexers receiving a differing one of a plurality of bits comprising the first value and a differing one of a plurality of bits comprising the second value.

* * * * *